(12) United States Patent
Yoshida et al.

(10) Patent No.: US 7,087,316 B2
(45) Date of Patent: Aug. 8, 2006

(54) LOW-EXPANSION UNIT, METHOD OF MANUFACTURING THE SAME AND SEMICONDUCTOR PROVIDED WITH THE SAME

(75) Inventors: Takashi Yoshida, Kariya (JP); Kyoichi Kinoshita, Kariya (JP); Katsufumi Tanaka, Kariya (JP); Tomohei Sugiyama, Kariya (JP); Hidehiro Kudo, Kariya (JP); Eiji Kono, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 237 days.

(21) Appl. No.: 10/655,278

(22) Filed: Sep. 3, 2003

(65) Prior Publication Data
US 2005/0031889 A1 Feb. 10, 2005

(30) Foreign Application Priority Data
Sep. 6, 2002 (JP) ............................ P2002-261248

(51) Int. Cl.
*H01L 23/36* (2006.01)
*H01L 23/373* (2006.01)
*B32B 15/18* (2006.01)
*B32B 15/01* (2006.01)

(52) U.S. Cl. ........................ 428/620; 428/679; 428/681

(58) Field of Classification Search ...................... None
See application file for complete search history.

(56) References Cited

U.S. PATENT DOCUMENTS
5,590,524 A * 1/1997 Moore et al. .................. 60/323
(Continued)

FOREIGN PATENT DOCUMENTS
EP         0 871 219        10/1998
(Continued)

OTHER PUBLICATIONS

Daniel Giesecke et al., "High Power Thick Film Circuitry on Pecos (Porcelain Enamel Coating on Steel) Substrates," Electro International 1994 Conference Proceedings, Boston, MA, May 10-12, 1994, pp. 847-854.

*Primary Examiner*—Jennifer McNeil
*Assistant Examiner*—Jason L. Savage
(74) *Attorney, Agent, or Firm*—Morgan & Finnegan, LLP

(57) ABSTRACT

A low-expansion unit includes a plate member and an iron-nickel layer. Upper and lower surface layers of the plate member each have the iron-nickel layer thereon and/or therein. While the plate member has a relatively large thermal expansion coefficient, the iron-nickel layers, which are formed on and/or in the upper and lower surface layers of the plate member, have a relatively small thermal expansion coefficient. Therefore, thermal expansion coefficient of the low-expansion unit is as a whole restrained to a relatively small value. Also, the plate member includes pure iron whose thermal conductivity is relatively high. Meanwhile, the iron-nickel layers, which are formed on the plate member, are relatively thin. Therefore, the low-expansion unit has a relatively large thermal conductivity in a direction of thickness thereof.

14 Claims, 3 Drawing Sheets

U.S. PATENT DOCUMENTS

| | | | | |
|---|---|---|---|---|
| 5,604,378 | A | * 2/1997 | Kimura et al. | 257/706 |
| 5,844,310 | A | * 12/1998 | Okikawa et al. | 257/712 |
| 6,032,362 | A | * 3/2000 | Okikawa et al. | 29/890.03 |
| 6,045,927 | A | * 4/2000 | Nakanishi et al. | 428/614 |
| 6,114,048 | A | 9/2000 | Jech et al. | 428/547 |
| 6,129,993 | A | * 10/2000 | Kumamoto et al. | 428/614 |
| 6,154,364 | A | * 11/2000 | Girrens et al. | 361/704 |
| 6,391,422 | B1 | 5/2002 | Mori et al. | 428/131 |
| 6,753,093 | B1 | * 6/2004 | Tanaka et al. | 428/615 |
| 6,902,843 | B1 | * 6/2005 | Ishizuka et al. | 429/166 |

FOREIGN PATENT DOCUMENTS

| | | |
|---|---|---|
| JP | 63-20448 | 2/1988 |
| JP | 63-20449 | 2/1988 |

* cited by examiner

LOW-EXPANSION UNIT, METHOD OF MANUFACTURING THE SAME AND SEMICONDUCTOR PROVIDED WITH THE SAME

BACKGROUND OF THE INVENTION

The present invention relates to a low-expansion unit and in particular to the low-expansion unit that is utilized as a heat spreader for use in a semiconductor apparatus. The present invention also relates to a method of manufacturing such a low-expansion unit and to a semiconductor apparatus provided with the low-expansion unit.

A prior art semiconductor apparatus is shown in FIG. 4. In the prior art structure, an insulated layer 2 is formed on a surface of a substrate 1 made of aluminum. A semiconductor device 4 is joined on a wiring layer, which is formed on a surface of the insulated layer 2 and is not shown, through a solder 3.

The heat generated by the semiconductor device 4 is transmitted to the substrate 1 through the insulated layer 2. Because the substrate 1 is made of aluminum, whose thermal conductivity is relatively superior, the heat is efficiently radiated from the substrate 1 to the outside thereof.

In the above structure, while the semiconducting material such as silicon used in the semiconductor device 4 has a relatively small thermal expansion coefficient, aluminum, which is used in the substrate 1, has a relatively large thermal expansion coefficient. Therefore, thermal stress is generated between the substrate 1 and the semiconductor device 4 as a consequence of a change of temperature. This thermal stress can cause the semiconductor device 4 to warp and the solder 3, which is used for joining the semiconductor device 4 to the insulated layer 2, to crack.

In order to relax the thermal stress, for example, in a semiconductor apparatus for use in a vehicle where temperature differential is extremely large, a heat spreader 5 is installed between the semiconductor device 4 and the insulated layer 2. (See FIG. 5)

As shown in FIG. 6, the heat spreader 5 is a composite material in which at least a copper material 7 sandwiches a plate 6 made of invar on both surfaces of the plate 6. Japanese Unexamined Utility Modal Publication Nos. 63-20448 and 63-20449 disclose such heat spreaders. Invar is an alloy whose thermal expansion coefficient is extremely small. Consequently, the plate 6 is hardly expanded by heat at normal temperature. Therefore, thermal stress is relaxed by installing the semiconductor device 4 on the heat spreader 5.

Still referring to FIG. 6, in the heat spreader 5, the plate 6 made of invar has a relatively low thermal conductivity, about 10 W/mK. Therefore, while the copper material 7 has a relatively superior thermal conductivity, the thermal conductivity in the direction of thickness of the heat spreader 5, which is formed by sandwiching the plate 6 with the copper material 7, becomes relatively low. In this case, the thermal conductivity is about 30 W/mK. Due to the relatively low thermal conductivity, radiating performance of the heat spreader 5 is lowered. Furthermore, the composite material for use in the heat spreader 5 is relatively costly.

SUMMARY OF THE INVENTION

The present invention is directed to a low-expansion unit whose thermal conductivity is relatively high and whose cost is relatively low. The present invention is also directed to a method of manufacturing the low-expansion unit and to a semiconductor apparatus provided with the low-expansion unit.

The present invention has the following first feature. A low-expansion unit includes a plate member and an iron-nickel layer. The plate member is made of iron series material and has a surface layer. The iron-nickel layer is formed on and/or in the surface layer.

The present invention also has the following second feature. A method of manufacturing a low-expansion unit includes the steps of preparing a plate member made of iron series material, forming a nickel layer on a surface of the plate member, and forming an iron-nickel layer on and/or in a surface layer of the plate member by diffusing nickel in the nickel layer inside of the plate member by heat treatment after the nickel layer forming step.

The present invention also has the following third feature. A method of manufacturing a low-expansion unit includes the steps of preparing a plate member made of iron series material, and forming an iron-nickel layer on and/or in a surface layer of the plate member by simultaneously sputtering iron and nickel on a surface of the plate member.

The present invention also has the following fourth feature. A semiconductor apparatus includes a low-expansion unit and a semiconductor device. The low-expansion unit further includes a plate member and an iron-nickel layer. The plate member is made of iron series material and has a surface layer. The iron-nickel layer is formed on and/or in the surface layer. The semiconductor device is joined to a surface of the low-expansion unit.

The present invention also has the following fifth feature. A semiconductor apparatus includes a low-expansion unit, a semiconductor device, an insulated layer and a substrate. The low-expansion unit further includes a plate member, a first iron-nickel layer and a second iron-nickel layer. The plate member is made of iron series material and has a first surface layer and a second surface layer that are located at the opposite sides thereof. The first iron-nickel layer is formed on and/or in the first surface layer. The second iron-nickel layer is formed on and/or in the second surface layer. The semiconductor device is joined on the first iron-nickel layer through a solder. The insulated layer is joined on the second iron-nickel layer through a solder. The substrate is formed on the insulated layer.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
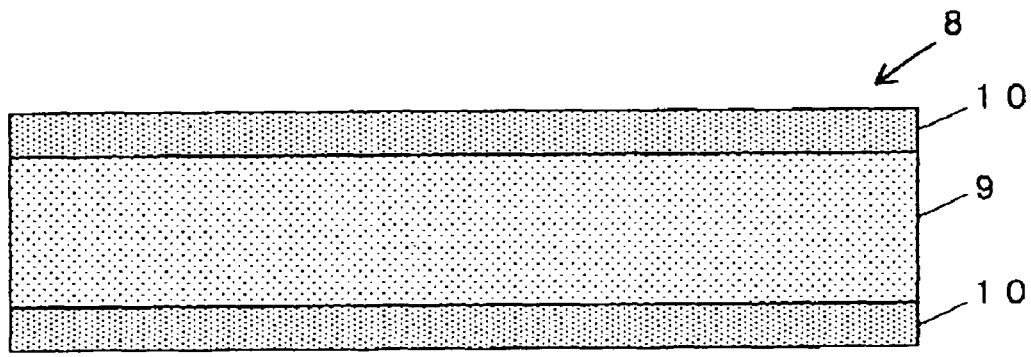
FIG. 1 is a cross sectional view illustrating a low-expansion unit according to a first preferred embodiment of the present invention.

A low-expansion unit according to a first preferred embodiment of the present invention will now be described with reference to FIG. 1. FIG. 1 shows a cross sectional view of a low-expansion unit 8 which includes a plate member 9 and an iron-nickel layer 10. Upper and lower surface layers of the plate member 9 each have the iron-nickel layer 10 thereon and/or therein.

In the first preferred embodiment, while the plate member 9 has a relatively large thermal expansion coefficient, the iron-nickel layers 10, which are formed on and/or in the upper and lower surface layers of the plate member 9, have a relatively small thermal expansion coefficient. Therefore, thermal expansion coefficient of the low-expansion unit 8 is as a whole restrained to a relatively small value.

Also, the plate member 9 includes pure iron whose thermal conductivity is relatively high. In the present embodiment, the thermal conductivity is about 80 W/mK. Meanwhile, the iron-nickel layers 10, which are formed on the plate member 9, are relatively thin. Therefore, the low-expansion unit 8 has a relatively large thermal conductivity in the direction of thickness thereof.

Figure 2A:
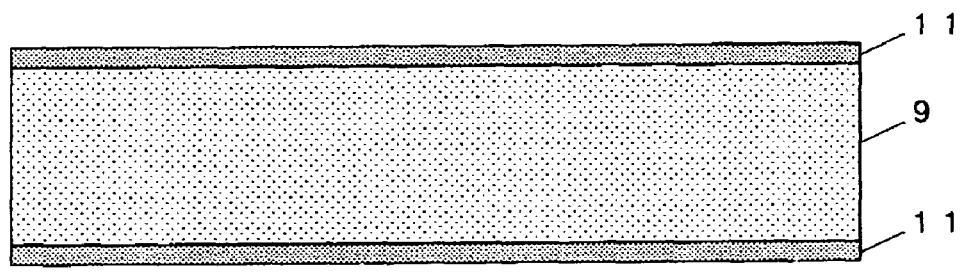
FIGS. 2A and 2B are cross sectional views illustrating processes of a method of manufacturing a low-expansion unit according to a second preferred embodiment of the present invention.

Now, a method of manufacturing a low-expansion unit 8 according to a second preferred embodiment will be described with reference to FIGS. 2A and 2B. In the second preferred embodiment, identical reference numerals to the first embodiment are applied to the same or corresponding members in the second preferred embodiment and overlapped description is omitted. Referring to FIG. 2A, upper and lower surfaces of the plate member 9 made of pure iron are plated with nickel. Thereby, a nickel layer 11 is formed on and/or in each of the upper and lower surfaces of the plate member 9.

Figure 2B:
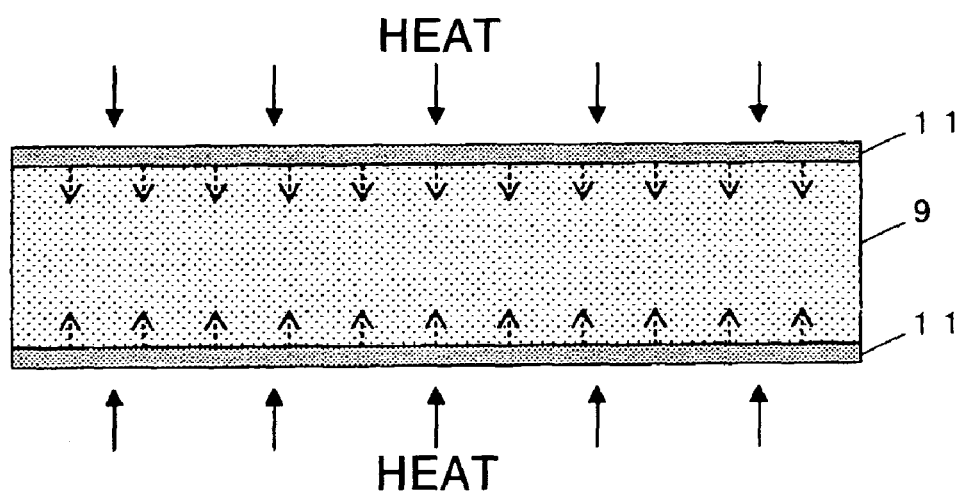

Subsequently, as shown in FIG. 2B, nickel in the nickel layer 11 is diffused inside of the plate member 9 by heat treatment. Thereby, an iron-nickel layer is formed on and/or in a surface layer of the plate member 9. Thus, as shown in FIG. 1, the low-expansion unit 8, which has an iron-nickel layer 10 on and/or in each of the upper and lower surface layers thereof, is manufactured.

In the second preferred embodiment, the pure iron, which is used as a main raw material of the low-expansion unit 8, is relatively inexpensive. In addition, the low-expansion unit 8 is easily manufactured by heat-treating the plate member 9 plated with nickel. Therefore, the low-expansion unit 8 is obtained at an extremely low price.

Also, since density of nickel is relatively high near the surface of the low-expansion unit 8, solder wetability is improved. Furthermore, since the surface of the low-expansion unit 8 is covered with nickel, oxidation of the plate member 9 is prevented.

Figure 3:
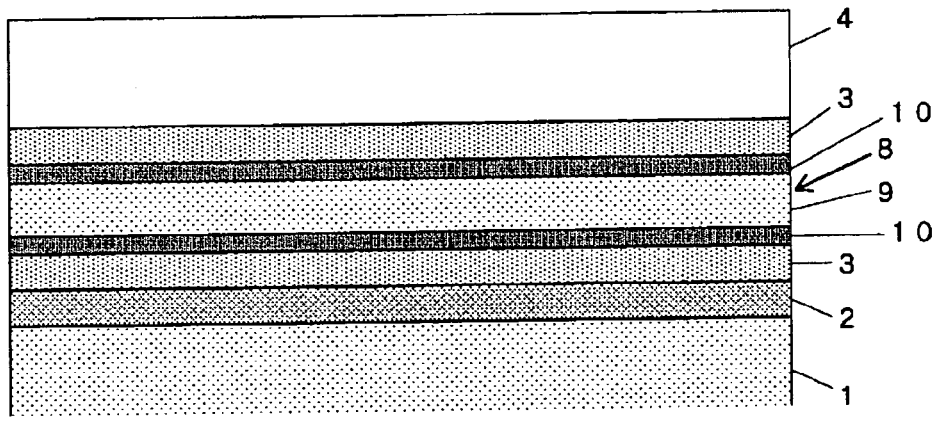
FIG. 3 is a cross sectional view illustrating a semiconductor apparatus provided with a low-expansion unit according to a third preferred embodiment of the present invention.
Figure 4:
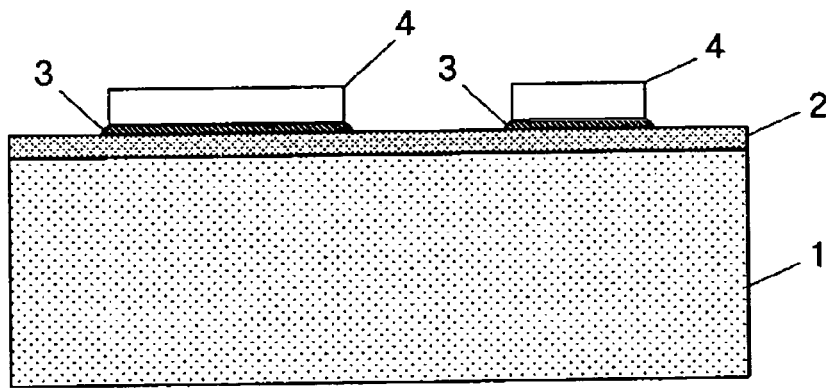
FIG. 4 is a cross sectional view illustrating a prior art semiconductor apparatus.
Figure 5:
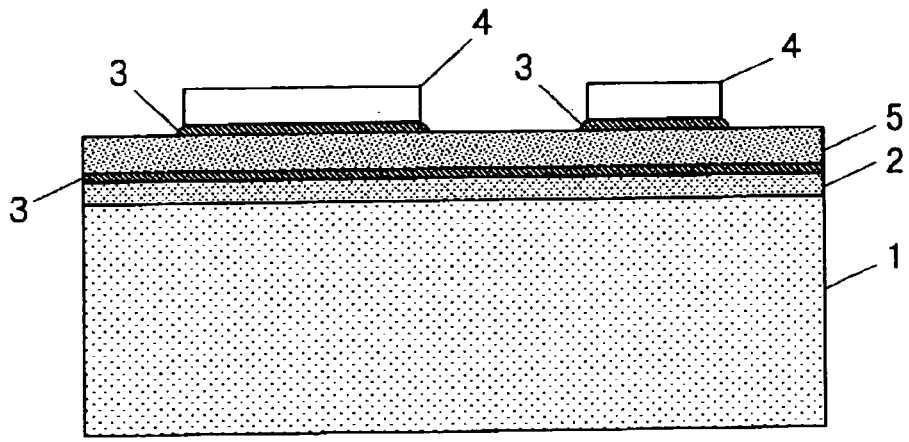
FIG. 5 is a cross sectional view illustrating another prior art semiconductor apparatus.
Figure 6:
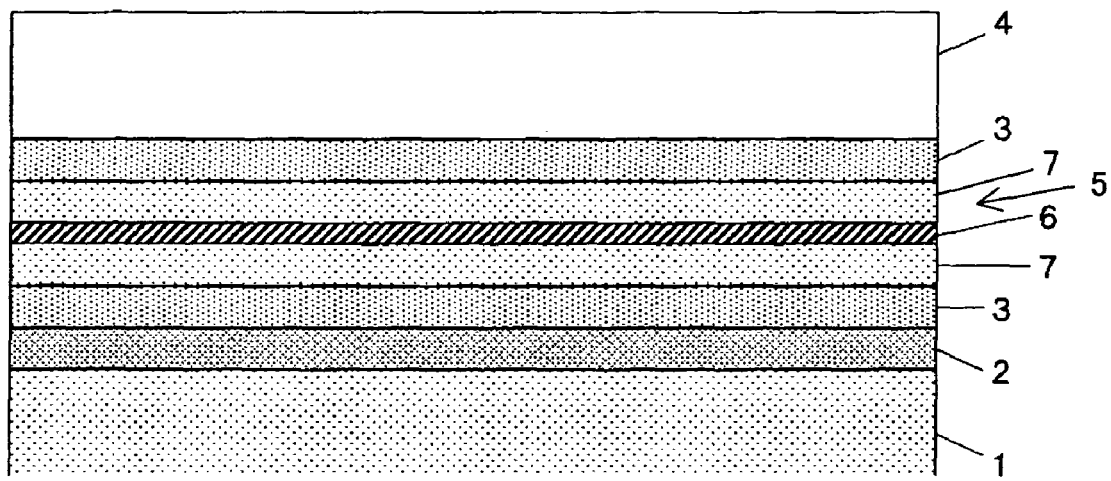
FIG. 6 is an enlarged cross sectional view illustrating the prior art semiconductor apparatus of FIG. 5.

A semiconductor apparatus according to a third preferred embodiment will be described with reference to FIG. 3. In the third preferred embodiment, identical reference numerals to the first embodiment are applied to the same or corresponding members in the third preferred embodiment and overlapped description is omitted. Referring to FIG. 3, the semiconductor apparatus has a low-expansion unit 8 which is used as a heat spreader. An insulated layer 2 is formed on the surface of a substrate 1 made of aluminum. The lower iron-nickel layer 10 of the low-expansion unit 8 is joined on a wiring layer, which is formed on the surface of the insulated layer 2 and is not shown in FIG. 3, through solder 3. Furthermore, the semiconductor device 4 is joined on the upper iron-nickel layer 10 of the low-expansion unit 8 through the solder 3.

In the third preferred embodiment, the plate member 9 of the low-expansion unit 8 has a relatively high thermal conductivity. Heat generated by the semiconductor device 4 is transmitted to the upper iron-nickel layer 10 of the low-expansion unit 8, which is joined to the semiconductor device 4 through the solder 3. Subsequently, the heat is transmitted to the lower iron-nickel layer 10 of the lower low-expansion unit 8 through the plate member 9 placed in the middle of the low-expansion unit 8. Further, the heat is then transmitted to the substrate 1 through the insulated layer 2, which is joined to the lower iron-nickel layer 10 of the low-expansion unit 8 through the solder 3. Since the substrate 1 is made of aluminum whose thermal conductivity is relatively superior, the heat is efficiently radiated from the substrate 1 to the outside thereof.

In the present invention, the following alternative embodiments are also practiced.

In the above-described second preferred embodiment, the nickel layer 11 of the low-expansion unit 8 is formed by plating the low-expansion unit 8 with nickel. In alternative embodiments to the second embodiment, the nickel layer 11 of the low-expansion unit 8 is formed by any one of thermal spraying, casting and sputtering in place of plating the low-expansion unit 8 with nickel.

Furthermore, in alternative embodiments to the second embodiment, the iron-nickel layer 10 is formed on and/or in a surface layer of the plate member 9 by simultaneously sputtering iron and nickel on the surface of the plate member 9. Thereby, the low-expansion unit 8 is, as shown in FIG. 1, manufactured.

In the above-described third preferred embodiment, the low-expansion unit 8 is utilized as a heat spreader for the semiconductor apparatus. In an alternative embodiment to the third embodiment, the low-expansion unit 8 is utilized as a substrate for the semiconductor apparatus in place of utilizing as a heat spreader for the semiconductor apparatus.

In all the above-described embodiments, for the pure iron which constitutes the plate member 9, electrolytic iron or electromagnetic soft iron is used. In view of its availability, the use of the electromagnetic soft iron is preferable.

In all the above-described embodiments, the plate member 9 is made of pure iron. In alternative embodiments to all the above-described embodiments, the plate member 9 is not limited to the plate member 9 made of pure iron. In alternative embodiments to all the above-described embodiments, a plate member 9 is made of iron series material such as killed steel and soft steel. Note that thermal conductivity of the iron series material is preferably in a range of about 60 W/mK to about 80 W/mK. Especially in view of the thermal conductivity, the use of the pure iron whose thermal conductivity is 80 W/mK is preferable.

Therefore, the present examples and embodiments are to be considered as illustrative and not restrictive and the invention is not to be limited to the details given herein but may be modified within the scope of the appended claims.

What is claimed is:

1. A method of manufacturing a low-expansion unit, comprising the steps of:
   preparing a plate member made of iron series material;
   forming a nickel layer on a surface of the plate member; and
   forming an iron-nickel layer on and/or in a surface layer of the plate member by diffusing nickel in the nickel layer inside of the plate member by heat treatment after the nickel layer forming step.

2. The method according to claim 1, wherein the nickel layer is formed by any one of plating, thermal spraying, casting and sputtering.

3. A method of manufacturing a low-expansion unit, comprising the steps of:
preparing a plate member made of iron series material; and
forming an iron-nickel layer on and/or in a surface layer of the plate member by simultaneously sputtering iron and nickel on a surface of the plate member.

4. A semiconductor apparatus comprising:
a low-expansion unit comprising;
a plate member made of iron series material, the plate member having a surface layer; and
an iron-nickel layer formed on and/or in the surface layer; and
a semiconductor device joined to a surface of the low-expansion unit.

5. The semiconductor apparatus according to claim 4, wherein the iron series material is pure iron.

6. The semiconductor apparatus according to claim 5, wherein the pure iron is electrolytic iron.

7. The semiconductor apparatus according to claim 5, wherein the pure iron is electromagnetic soft iron.

8. The semiconductor apparatus according to claim 4, wherein the iron series material is killed steel.

9. The semiconductor apparatus according to claim 4, wherein the iron series material is soft steel.

10. The semiconductor apparatus according to claim 4, wherein the iron series material has a thermal conductivity of from about 60 W/mK to about 80 W/mK.

11. The semiconductor apparatus according to claim 10, wherein the thermal conductivity is about 80 W/mK.

12. The semiconductor apparatus according to claim 4, wherein the low-expansion unit is used as a heat spreader.

13. The semiconductor apparatus according to claim 4, wherein the low-expansion unit is utilized as a substrate.

14. A semiconductor apparatus comprising:
a low-expansion unit comprising:
a plate member made of iron series material, the plate member having a first surface layer and a second surface layer that are located at the opposite sides thereof;
a first iron-nickel layer formed on and/or in the first surface layer; and
a second iron-nickel layer formed on and/or in the second surface layer,
a substrate placed at the first iron-nickel layer side;
an insulated layer formed on the substrate, the insulated layer being joined on the first iron-nickel layer through a solder; and
a semiconductor device joined on the second iron-nickel layer through a solder.

* * * * *